(12) United States Patent
Kang et al.

(10) Patent No.: US 6,759,284 B2
(45) Date of Patent: Jul. 6, 2004

(54) METHOD FOR POLYSILICON CRYSTALLIZATION BY SIMULTANEOUS LASER AND RAPID THERMAL ANNEALING

(75) Inventors: Yu-Ming Kang, Chubei (TW); Shih-Ping Lin, Dungshan Shiang (TW); Ting-Kuo Chang, Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 109 days.

(21) Appl. No.: 10/236,608

(22) Filed: Sep. 6, 2002

(65) Prior Publication Data

US 2004/0048453 A1 Mar. 11, 2004

(51) Int. Cl.[7] .......................... H01L 21/20; H01L 21/48; H01L 21/84
(52) U.S. Cl. .......................... 438/151; 438/30; 438/154; 438/166; 438/486
(58) Field of Search ................................ 438/151, 154, 438/156, 166, 30, 486

(56) References Cited

U.S. PATENT DOCUMENTS

| | | | | |
|---|---|---|---|---|
| 5,336,641 A | * | 8/1994 | Fair et al. .................... | 438/486 |
| 5,891,764 A | * | 4/1999 | Ishihara et al. ............. | 438/151 |
| 6,130,397 A | * | 10/2000 | Arai ....................... | 219/121.37 |
| 6,329,229 B1 | * | 12/2001 | Yamazaki et al. .......... | 438/166 |
| 6,482,752 B1 | * | 11/2002 | Yamazaki et al. .......... | 438/758 |
| 6,582,996 B1 | * | 6/2003 | Hara et al. .................. | 438/166 |
| 6,602,765 B2 | * | 8/2003 | Jiroku et al. ................ | 438/487 |
| 6,621,044 B2 | * | 9/2003 | Jain et al. ................. | 219/121.7 |
| 6,642,073 B1 | * | 11/2003 | Zhang et al. ................. | 438/30 |
| 6,660,575 B1 | * | 12/2003 | Zhang ........................ | 438/166 |
| 6,673,126 B2 | * | 1/2004 | Miyasaka .................. | 29/25.01 |

* cited by examiner

*Primary Examiner*—Michael Lebentritt
(74) *Attorney, Agent, or Firm*—Tung & Associates

(57) ABSTRACT

A method for polysilicon crystallization by simultaneous laser and rapid thermal annealing is disclosed. In the method, a substrate that has an amorphous silicon layer on top is first provided and positioned on a conveyor situated inside a temperature-controlled chamber. The temperature-controlled chamber is equipped with a window in a top wall that is substantially transparent to thermal and laser energy. A beam of thermal energy and simultaneously a beam of laser energy merged with the thermal energy is then directed through the window onto a top surface of the substrate to convert an amorphous silicon film into a polysilicon film.

20 Claims, 1 Drawing Sheet

METHOD FOR POLYSILICON CRYSTALLIZATION BY SIMULTANEOUS LASER AND RAPID THERMAL ANNEALING

FIELD OF THE INVENTION

The present invention generally relates to a method for crystallization of an amorphous silicon film into a polysilicon film and more particularly, relates to a method for polysilicon crystallization from amorphous silicon by a simultaneous laser and rapid thermal annealing process.

BACKGROUND OF THE INVENTION

There are numerous methods for converting an amorphous silicon into crystallized polysilicon has been developed and used. Excimer laser crystallization of amorphous silicon films is a promising method for fabricating polysilicon thin film transistor on glass substrate for application of active matrix liquid crystal displays. Excimer laser annealing has been shown to be superior to other crystallization techniques because of its high efficiency. In addition, it is a low temperature processing technique since the entire process takes place in only about 200 ns, consequently inducing a shallow heat-affected zone in the glass material. This interesting feature of excimer laser crystallization allows the use of inexpensive glass substrates instead of quartz substrates.

When a silicon film is deposited at a deposition temperature below 450° C. using plasma enhanced chemical vapor deposition, the deposited film exhibits an amorphous structure. This can be confirmed by the fact that only a detraction pattern of defuse rings can be found in a transmission electron microscope image.

To convert an amorphous silicon to polysilicon, a subsequent annealing process after deposition can be used. The excimer laser process, furnace or rapid thermal annealing process, can be used to crystallize the amorphous film to polycrystalline.

While furnace annealing and laser annealing have been used to convert amorphous silicon to polysilicon, both techniques have severe drawbacks and limitations. For instance, in the conventional fabrication process for polysilicon thin film transistors, an excimer laser is used for annealing or crystallization of an amorphous silicon film. Since the excimer laser is of the pulse laser type, the period between pulses is only between 40 and 100 nano-seconds. Moreover, the energy of each pulse is in the low range of about 1 joule. As a result, the excimer laser is only effective in annealing a small area by scanning and a high level of overlapping is necessary to make up for the short period characteristics of the excimer laser and to obtain a satisfactory crystallization result. The conventional excimer laser therefore can only produce a low throughput for the crystallization process. Moreover, the variation in energy level between pulses of the excimer laser renders the process control difficult leading to a narrow process window that is available for the laser annealing method.

The conventional furnace annealing process, or the rapid thermal annealing (RTA) process, while producing high enough throughput for crystallization, the polycrystalline produced does not have the necessary high quality of large grain crystals, especially when compared to the grain size of crystals obtained by the laser annealing process.

It is therefore an object of the present invention to provide a method for polysilicon crystallization from amorphous silicon that does not have the drawbacks or shortcomings of the conventional thermal or laser annealing methods.

It is another object of the present invention to provide a method for polysilicon crystallization by the simultaneous annealing of laser energy and thermal energy.

It is another object of the present invention to provide a method for polysilicon crystallization by the simultaneous annealing of an excimer laser and the thermal energy from a Xe arc heating source.

It is another further object of the present invention to provide a method for polysilicon crystallization by moving a substrate on a conveyor under a combined energy source of laser and heat.

It is still another object of the present invention to provide a method for polysilicon crystallization by first merging an energy beam of laser and an energy beam of a thermal source and then irradiating the merged beam onto an amorphous silicon surface.

It is yet another object of the present invention to provide a method for polysilicon crystallization by using an excimer laser and a tubular Xe arc lamp simultaneous producing a merged energy beam on an amorphous silicon film.

SUMMARY OF THE INVENTION

In accordance with the present invention, a method for polysilicon crystallization by simultaneous laser and rapid thermal annealing is provided.

In a preferred embodiment, a method for polysilicon crystallization by simultaneous laser and rapid thermal annealing can be carried out by the operating steps of first providing a substrate that has an amorphous silicon layer on top; positioning the substrate on a conveyor situated inside a temperature-controlled chamber; providing a window that is substantially transparent to thermal and laser energy in a top wall of the temperature-controlled chamber; and directing a beam of thermal energy and simultaneously a beam of laser energy merging with the beam of thermal energy through the window onto a top surface of the substrate converting the amorphous silicon into polysilicon.

The method for polysilicon crystallization by simultaneous laser and rapid thermal annealing may further include the step of mounting a quartz window in the top wall of the temperature-controlled chamber, or the step of positioning a partially reflective lens in a path of the beam of thermal energy, or the step of positioning a partially transmissive lens in a path of the beam of thermal energy.

The method may further include the step of generating the beam of thermal energy by a radiation source selected from the group consisting of Xe arc lamp, Ar arc lamp, Kr arc lamp and W/halogen lamp. The method may further include the step of generating the beam of laser energy by an excimer laser source, or the step of generating the beam of laser energy by a XeCl laser source. The method may further include the step of producing the thermal energy by a tubular Xe arc lamp. The method may further include the step of reflecting incident beams of the thermal energy emitted by an arc lamp of a partially reflective lens prior to passing through the window, or the step of directing the beam of laser energy in a straight line through the partially reflective lens prior to passing through the window, or the step of reflecting thermal energy of a tubular Xe arc lamp by an oval-shaped mirror producing the incident beams.

The present invention is further directed to a method for crystallizing an amorphous silicon film into a polysilicon film by simultaneously irradiating with laser and thermal energy which can be carried out by the operating steps of first producing a laser beam and directing downwardly through a window into a process chamber; producing a thermal energy beam for reflecting downwardly by a partially reflective lens through the window merging with the laser beam; directing the merged laser and thermal energy beams onto an amorphous silicon film on a pre-processed substrate; and moving the pre-processed substrate linearly under the merged laser and thermal energy beams at a predetermined speed until the amorphous silicon film is converted to polysilicon film.

The method for crystallizing an amorphous silicon film into a polysilicon film by simultaneously irradiating with laser and thermal energy may further include the step of positioning a partially transmissive lens between a laser beam source and the pre-processed substrate for merging the laser beam with the thermal energy beam. The method may further include the step of positioning a partially reflective lens between a thermal energy source and the pre-processed substrate for merging the laser beam with the thermal energy beam. The partially reflective lens may be partially transmissive. The method may further include the step of preheating the process chamber to a temperature of at least 600° C., or the step of moving the pre-processed substrate on a conveyor at a speed higher than 1 cm/min. The method may further include the step of producing the laser beam by an excimer laser source, such as an XeCl laser source. The method may further include the step of producing the thermal energy beam by a source selected from the group consisting of Xe arc lamp, Ar arc lamp, Kr arc lamp and W/halogen lamp.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
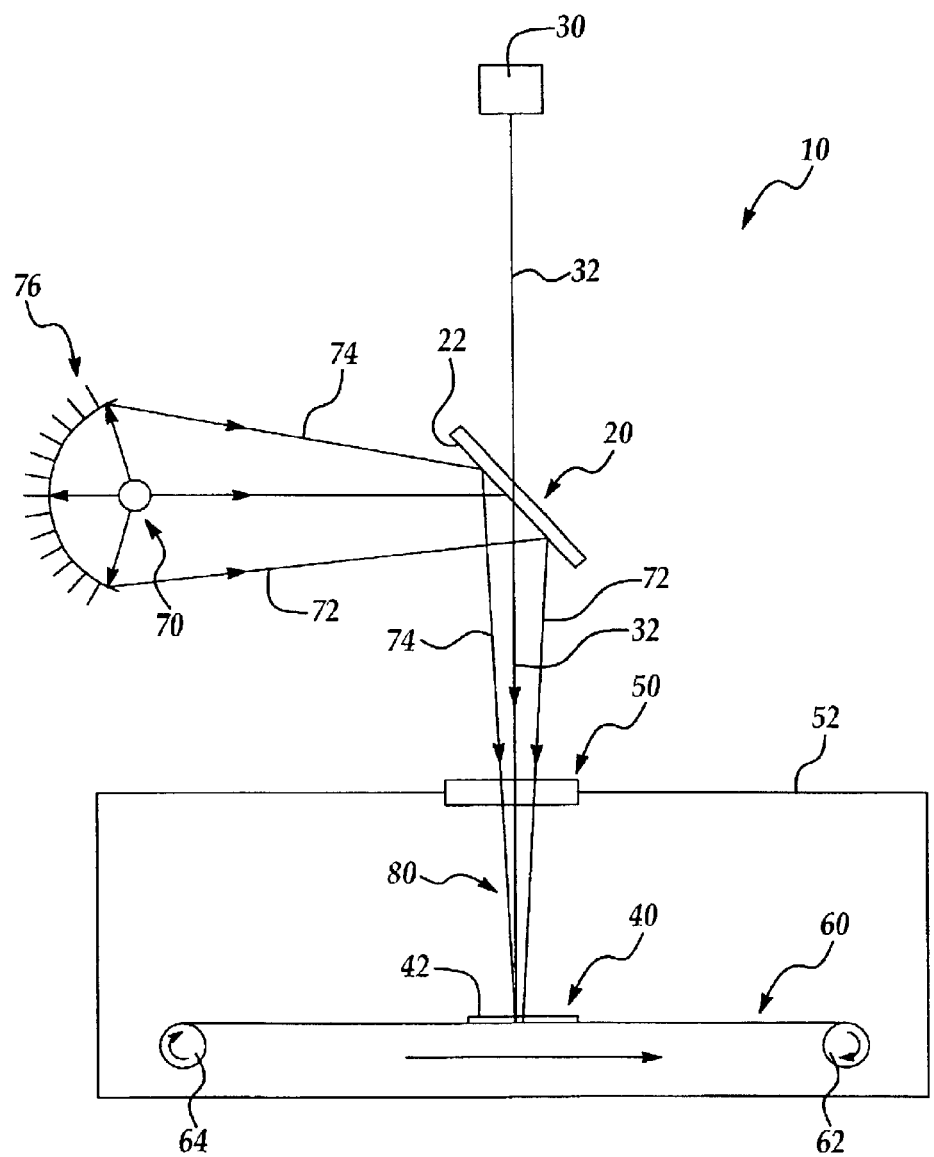
FIG. 1 is a schematic of the present invention set-up using a tubular Xe arc lamp, an excimer laser, a partially reflective lens, a quartz window, a temperature-controlled chamber and a conveyor.

The present invention discloses a method for crystallizing an amorphous silicon film into a polysilicon film by the combined effect of annealing of a laser energy source and a rapid thermal source simultaneously.

The laser energy source utilized in the present invention method may be an excimer laser, or a paused laser source such as XeCl. In a preferred embodiment, the rapid thermal energy source utilized is a tubular arc lamp such as that of Xe arc lamp, Ar arc lamp, Kr arc lamp or tungsten/halogen lamp.

The present invention novel method producing a synergistic effect between the laser energy source and the rapid thermal source when the two energy beams are merged together by a partially reflective lens positioned in-between the energy sources and the sample substrate. The synergistic effect produced captures the best qualities of both methods for laser annealing and thermal annealing. For instance, the present invention novel method has the benefit of a large throughput, gained from the thermal annealing method, and large grain crystals, or better quality crystals, gained from the laser annealing method. The present invention novel method therefore utilizes the desirable benefits of both methods while remedies the shortcomings of both methods.

The present invention novel method further provides the benefit of improving the throughput of conversion of an amorphous silicon into polysilicon by annealing, minimizing the effect of energy variations between pulses of an excimer laser on the crystal formation, and improving the properties of the polysilicon crystals grown by annealing, i.e., obtaining larger grain sized crystals.

By utilizing the present invention novel method, a rapid thermal heating lamp and an excimer laser are used simultaneously to anneal an amorphous silicon film. The rapid thermal heating source is mainly used to pre-heat the amorphous silicon film and to post-heat the film after melting. The excimer laser performs the major function of melting the amorphous silicon film and causing recrystallization.

The present invention novel method, when compared to the convention annealing method, provides a higher throughput, allowing a longer period of time for silicon atoms to rearrange during the recrystallization process, and furthermore, increases the crystallinity and the surface roughness of the polysilicon film. Moreover, the simultaneous use of a merged laser and rapid thermal sources enables the effect of pulse-to-pulse energy variations to be minimized and thus, the effect on crystallization result.

Referring now to FIG. 1, wherein a schematic of the present invention method or set-up is shown.

By utilizing the present invention novel method, an optical system 20, such as that shown in FIG. 1 of a partially reflective/partially transmissive lens is first provided in system 10. An excimer laser source 30 emits a laser beam 32 directed toward a sample substrate 40 is first provided. The partially transmissive lens 20 is essentially transparent to the laser beam 32 such as to allow the laser beam 32 to pass through the lens 20 and an optical window 50, such as a quartz window, to reach the top surface 42 of the substrate 40. The top surface 42 of the substrate 40 is coated with a thin film of amorphous silicon for converting to polysilicon.

The substrate 40 is positioned on a conveyor 60 which is in turn driven by a set of rollers 62, 64 to advance at a desirable, predetermined speed. A suitable predetermined speed may be larger than 1 cm/min., or in the range between about 1 cm/min. and about 300 cm/min. The scanning speed of the energy beam of combined laser and thermal on the substrate 40 depends on many processing variables, such as the film thickness of the amorphous silicon, the temperature of the process chamber 52, the energy level of the laser beam 32, and the thermal beam 72, 74 produced by the thermal energy source 70.

The thermal energy source 70, may be suitably an arc lamp such as a Xe arc lamp, an Ar arc lamp or a Kr arc lamp. The thermal energy source 70 may also be a tungsten/halogen lamp. The thermal energy source 70 should be provided suitably in a tubular form. An end view of the tubular-shaped energy source is shown in FIG. 1. The thermal energy emitted by the energy source 70 is reflected by an oval-shaped reflective mirror 76 to be reflected onto the partially reflective/partially transmissive lens 20 to irradiate on the substrate 40.

The present invention novel method is made possible by the use of the optical system, i.e. the optical lens 20 that is partially transmissive and partially reflective. By utilizing the lens 20, the thermal energy beams 72, 74 may be advantageously merged with the laser beam 32 such that a combined, synergistic energy beam 80 may be projected onto the substrate 40. The merging of the thermal energy and laser energy is important for producing the synergistic effect of the present invention novel method.

The thermal energy source 70 of the present invention may be suitably a tubular-shaped Xe arc lamp that has a peak energy spectrum at between about 300 nm and about 450 nm. By projecting the thermal energy on a suitably designed reflective surface 22, the thermal energy is condensed into a uniformly distributed elongated beam energy source. The substrate 40 may be positioned on a stage (not shown), or on the conveyor 60 directly to be transported under the merged energy beam 80 at a suitable, predetermined speed by the pair of rollers 62, 64.

The laser energy source 30 may further be equipped with an energy level controller and a temperature sensing/monitoring device for feedback control of the laser energy.

During an annealing process carried out in the present invention novel temperature-controlled chamber 52, a suitable energy intensity of the heating lamp, and a suitable scanning speed (or the conveyor speed) are used to prevent overheating of the substrate 40. Other processing perimeters, such as the laser intensity and the laser pulse overlapping rate can be used to control the repetition rate of the excimer laser. Under the thermal energy from the tubular-shaped thermal energy source 70, the temperature of the top surface 42 of the substrate 40 can first reach, in a pre-heating step, between about 700° C. and about 800° C. A dummy plate may first be used to test for a suitable substrate conveying speed by measuring temperature from a thermal couple mounted on the dummy plate. After the substrate 40 is pre-heated by the thermal energy source 70, the laser energy beam 32 is used to melt the amorphous silicon film and secondly, combining with the thermal energy, controlling the crystallization of silicon into a polysilicon film. The pre-heating of the thermal energy source of the substrate enables a lower laser energy density to be used, and thus allowing a larger dimension of the laser beam.

The post-heating of the substrate 40 by the thermal energy source 70 further reduces the repetition rate of the laser beam and thus, increasing the throughput of the annealing process by the combined laser/thermal energy beams. The continuing supply of thermal energy by the thermal energy lamp further allows the silicon atoms to have sufficient mobility in arranging better crystallinity, resulting in larger crystal grains being formed in the polysilicon film. By suitably controlling the contribution of the laser energy beam and the thermal energy beam, the present invention novel annealing method enables the achievement of maximum throughput and optimum properties of the crystallization process in the polysilicon film.

The present invention novel method for polysilicon crystallization by the simultaneous laser and rapid thermal annealing have therefore been amply described in the above description and in the appended drawing of FIG. 1.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for polysilicon crystallization by simultaneous laser and rapid thermal annealing comprising the steps of:

providing a substrate with an amorphous silicon layer on top;

positioning said substrate on a conveyor situated inside a temperature-controlled chamber;

providing a window that is substantially transparent to thermal and laser energy in a top wall of the temperature-controlled chamber; and directing a beam of thermal energy and simultaneously a beam of laser energy merging with said beam of thermal energy through said window onto a top surface of said substrate converting said amorphous silicon into polysilicon.

2. A method for polysilicon crystallization by simultaneous laser and rapid thermal annealing according to claim 1 further comprising the step of mounting a quartz window in said top wall of the temperature-controlled chamber.

3. A method for polysilicon crystallization by simultaneous laser and rapid thermal annealing according to claim 1 further comprising the step of positioning a partially reflective lens in a path of said beam of thermal energy.

4. A method for polysilicon crystallization by simultaneous laser and rapid thermal annealing according to claim 1 further comprising the step of positioning a partially transmissive lens in a path of said beam of thermal energy.

5. A method for polysilicon crystallization by simultaneous laser and rapid thermal annealing according to claim 1 further comprising the step of generating said beam of thermal energy by a radiation source selected from the group consisting of Xe arc lamp, Ar arc lamp, Kr arc lamp and W/halogen lamp.

6. A method for polysilicon crystallization by simultaneous laser and rapid thermal annealing according to claim 1 further comprising the step of generating said beam of laser energy by an excimer laser source.

7. A method for polysilicon crystallization by simultaneous laser and rapid thermal annealing according to claim 1 further comprising the step of generating said beam of laser energy by an excimer laser source of a XeCl.

8. A method for polysilicon crystallization by simultaneous laser and rapid thermal annealing according to claim 1 further comprising the step of producing said thermal energy by a tubular Xe arc lamp.

9. A method for polysilicon crystallization by simultaneous laser and rapid thermal annealing according to claim 1 further comprising the step of reflecting incident beams of said thermal energy emitted by an arc lamp off a partially reflective lens prior to passing through said window.

10. A method for polysilicon crystallization by simultaneous laser and rapid thermal annealing according to claim 1 further comprising the step of directing said beam of laser energy in a straight line through said partially reflective lens prior to passing through said window.

11. A method for polysilicon crystallization by simultaneous laser and rapid thermal annealing according to claim 9 further comprising the step of reflecting thermal energy of a tubular Xe arc lamp by an oval-shaped mirror producing said incident beams.

12. A method for crystallizing an amorphous silicon film into a polysilicon film by simultaneously irradiating with laser and thermal energy comprising the steps of:

producing a laser beam and directing downwardly through a window into a process chamber;

producing a thermal energy beam for reflecting downwardly by a partially reflective lens through said window merging with said laser beam;

directing said merged laser and thermal energy beams onto an amorphous silicon film on a pre-processed substrate; and moving said pre-processed substrate linearly under said merged laser and thermal energy beams at a predetermined speed until said amorphous silicon film is converted to polysilicon film.

13. A method for crystallizing an amorphous silicon film into a polysilicon film by simultaneously irradiating with laser and thermal energy according to claim 12 further comprising the step of positioning a partially transmissive lens between a laser beam source and said pre-processed substrate for merging said laser beam with said thermal energy beam.

14. A method for crystallizing an amorphous silicon film into a polysilicon film by simultaneously irradiating with laser and thermal energy according to claim 12 further comprising the step of positioning a partially reflective lens between a thermal energy source and said pre-processed substrate for merging said laser beam with said thermal energy beam.

15. A method for crystallizing an amorphous silicon film into a polysilicon film by simultaneously irradiating with laser and thermal energy according to claim 14, wherein said partially reflective lens is partially transmissive.

16. A method for crystallizing an amorphous silicon film into a polysilicon film by simultaneously irradiating with laser and thermal energy according to claim 12 further comprising the step of preheating said process chamber to a temperature of at least 600° C.

17. A method for crystallizing an amorphous silicon film into a polysilicon film by simultaneously irradiating with laser and thermal energy according to claim 12 further comprising the step of moving said pre-processed substrate on a conveyor.

18. A method for crystallizing an amorphous silicon film into a polysilicon film by simultaneously irradiating with laser and thermal energy according to claim 12 further comprising the step of producing said laser beam by an excimer laser source.

19. A method for crystallizing an amorphous silicon film into a polysilicon film by simultaneously irradiating with laser and thermal energy according to claim 12 further comprising the step of producing said laser beam by a XeCl laser.

20. A method for crystallizing an amorphous silicon film into a polysilicon film by simultaneously irradiating with laser and thermal energy according to claim 12 further comprising the step of producing said thermal energy beam by a source selected from the group consisting of Xe arc lamp, Ar arc lamp, Kr arc lamp and W/halogen lamp.

* * * * *